United States Patent

Caillat et al.

[11] Patent Number: 5,828,133
[45] Date of Patent: Oct. 27, 1998

[54] SUPPORT FOR AN ELECTROCHEMICAL DEPOSIT

[75] Inventors: Patrice Caillat, Echirolles; Claude Massit, St Ismier, both of France

[73] Assignee: Commissariat a l'Energie Atomique, Paris, France

[21] Appl. No.: 760,800

[22] Filed: Dec. 5, 1996

[30] Foreign Application Priority Data

Dec. 18, 1995 [JP] Japan .................................. 95 14972

[51] Int. Cl.⁶ .......................... H01L 23/48; H01L 23/52; H01L 29/40
[52] U.S. Cl. ............................. 257/766; 257/249
[58] Field of Search .................. 257/249, 252, 257/253, 254, 743, 745, 766

[56] References Cited

U.S. PATENT DOCUMENTS

| 4,202,001 | 5/1980 | Reichert et al. . | |
| 4,326,927 | 4/1982 | Stetter et al. . | |
| 4,868,920 | 9/1989 | Inoue et al. | 257/249 |
| 5,268,583 | 12/1993 | Chatard | 257/249 |
| 5,394,003 | 2/1995 | Bales et al. | 257/249 |

FOREIGN PATENT DOCUMENTS

| 4131731 A1 | 5/1993 | Germany . |
| 5267306 | 10/1993 | Japan . |
| 5340915 | 12/1993 | Japan . |
| 6242052 | 9/1994 | Japan . |
| 1127070 | 9/1968 | United Kingdom . |
| WO 94/22889 | 10/1994 | WIPO . |

OTHER PUBLICATIONS

Patent Abstracts of Japan, vol. 15, No. 442, (E-1131), Nov. 11, 1991, JP-03 185897, Aug. 13, 1991.

Sensors and Actuators A, vol. 43, pp. 296-301, 1994, R. Kakerow, et al. "A Monolithic Sensor Array of Individually Addressable Microelectrodes".

Patrice Caillat, et al., 5 pages, "Fluxless Flip-Chip Technology".

*Primary Examiner*—Sara W. Crane
*Assistant Examiner*—Phat X. Cao
*Attorney, Agent, or Firm*—Oblon, Spivak, McClelland, Maier & Neustadt, P.C.

[57] ABSTRACT

Support for an electrochemical deposit, comprising a substrate (120) and, on the latter, a plurality of first conductive surfaces (128) able to form electrodes, at least one second conductive surface (116) for forming a counterelectrode and means (130, 132, 133, 135) for connecting said first conductive surfaces and said second conductive surface to a voltage source.

20 Claims, 4 Drawing Sheets

SUPPORT FOR AN ELECTROCHEMICAL DEPOSIT

TECHNICAL FIELD

The present invention relates to a support for an electrochemical deposit and in particular an electrolytic deposit.

The term support is understood to mean a substrate which may or may not have logic and/or mechanical and/or chemical and/or optical functions. A support can e.g. be a chip or a group of microelectronic chips incorporating electrodes, i.e. sites able to receive an electrochemical deposit.

The invention has applications in the microelectronics field for depositing on electrodes electrically conductive materials at given locations. The invention can e.g. be used for producing a support with interconnection balls located on contact elements of a chip.

The invention also has applications in the production of biological analysis systems, in which polymers must be deposited at given locations on electrodes.

PRIOR ART

FIG. 1 briefly shows the elements of an equipment for making an electrochemical deposit on a support.

Into a tank 10 filled with an electrolyte 12 is immersed a part to be treated forming an electrode or a support with a conductive surface forming an electrode. This part is designated 14. A counterelectrode 16 is also immersed in the electrolyte. The electrode 14 and counterelectrode 16 are respectively electrically connected to the terminals of a voltage generator 18.

The electrolyte 12 generally has metal ions in solution which, as a function of their charge and the voltage applied by the generator 18, are deposited on the electrode 14.

This basic procedure is ever more frequently used. Initially reserved for the deposition of pure metals such as e.g. copper or nickel, at present it is more generally used for electrochemical deposits no longer calling on a displacement of single ions, but instead complex, organic, conductive compounds. Thus, it is possible to carry out a redox reaction on the part to be treated or the electrode, in order to copolymerize together the polymers.

In the remainder of the description, the electrolyte will be defined as a solution incorporating dissolved ions and/or polymers.

As described hereinbefore, electrochemical methods are well known and widely used in microelectronics. In the microelectronics field, electrochemical deposition is generally used for covering clearly defined parts and not the entire surface of a chip. Document (1), whose reference is given at the end of the description, e.g. describes a method used for depositing on the surface of a chip a conductive material, namely a tin and lead alloy.

The method corresponding to FIG. 2 and which is described in reference 1 has the following operations. On a wafer 14, which can e.g. have an electronic chip, is deposited over its entire surface a thin conductive layer 24. A resin layer 21 is then deposited and then irradiated through a mask, so that after development, the sites or where the deposit is to be made remain without resin. A contact 30 is made on the wafer by the thin conductive layer. The wafer is then immersed in an electrolyte. The contact 30 is connected to one terminal of the generator, whilst the other generator terminal is connected to a counterelectrode 16, which is also immersed in the electrolyte 12. Electrochemical deposition then takes place in the openings made in the resin. The wafer is then rinsed and then the resin is removed. This is followed by a chemical etching stage which removes the thin conductive layer. This leads to an electrochemically produced, localized deposit. This method is suitable for the deposition of the same compound on all the sites.

A second method can be used in the manner described in document (2) and illustrated by FIG. 3. In order to avoid the deposition on the entire wafer surface of a metal layer and also the use of a resin and a chemical etching, by means of discrete electric tracks 24a, 24b, 24c, connection takes place of the sites 28a, 28b, 28c where the deposits are to be made to the electrical terminals, which will then be connected to the voltage generator.

This method permits the selective, site by site deposition of a compound, because it is possible to address by the terminals one site and only one site at the same time. It is then sufficient to change the electrolyte, address via the terminal 30b another site 28b, followed by the deposition of another material, etc.

In the two methods described hereinbefore, the structure of the electrochemical cell (or tank) remains the same with a counterelectrode independent of the wafer located in the cell.

Document (3) shows a chip multiplexed with electrodes. The chip has an internal logic circuit permitting the addressing one by one of the electrodes from a limited number of external connection means.

In the known devices described hereinbefore, the total volume of the tank containing the electrolyte is relatively large. Thus, the volume must be sufficient to be able to contain both the part to be treated, e.g. a wafer, and the counterelectrodes. This is an important constraint if the electrolyte used is very expensive.

Moreover, when the electrolyte has a high resistivity deposit homogeneity problems can arise. These problems increase with the distance between the deposition site, i.e. the electrode, and the counterelectrode.

To provide a solution to these problems, one aim of the present invention is to propose a support for electrochemical deposition able to significantly reduce the electrolyte volume necessary for deposition purposes.

Another aim is to propose a support for an electrolytic deposit allowing a homogeneous deposit virtually independently of the resistivity of the electrolyte.

DESCRIPTION OF THE INVENTION

To achieve these aims, the support for the electrochemical deposit according to the invention is characterized in that it comprises a substrate and, on said substrate, a plurality of first conductive surfaces able to constitute electrodes, at least one second conductive surface able to constitute a counterelectrode and means for connecting said first conductive surfaces and said second conductive surface to a voltage source.

The substrate can be both passive and active. It can in particular fulfil logic and/or chemical and/or mechanical and/or optical functions. However, the substrate must be passive with respect to the chemical bath.

As the support integrates the counterelectrode, a significant volume gain can be obtained for the electrolyte bath tank.

Moreover, as the second conductive surface is formed on the same substrate as the first conductive surfaces, the distance between the electrode and counter electrode can be reduced.

According to an embodiment of the support, the substrate can have a strip of conductive material surrounding at least a portion of said plurality of first conductive surfaces and forming the second conductive surface.

According to another embodiment, the substrate can have a grid of conductive material forming the second conductive surface, the grid having a plurality of meshes and each mesh surrounds at least one of said first conductive surfaces.

According to another embodiment, the substrate can have a plurality of conductive material strips placed between the first conductive surfaces and interconnected, said strips forming the second conductive surface.

According to the arrangement of the conductive material strip or strips or the grid forming the counterelectrode, it is possible to adapt for each electrode the distance separating it from the counterelectrode. This contributes to an electrolytic deposit homogeneity improvement.

The first conductive surfaces and the second conductive surface can be made from a material chosen e.g. from Al, Au, Pt, Ag, Ni, etc.

According to an aspect of the invention, the support can have a plurality of microelectronic chips, in which each chip can be provided with at least one of said first conductive surfaces. According to the invention, a chip represents a grouping of electrodes on a passive or active substrate.

Thus, advantageously, it is possible to simultaneously treat several identical or different chips by covering by an electrochemical deposit their electrode-forming conductive surfaces.

When several electrolyte baths are used, it is possible to produce deposits of different materials for different conductive surfaces of each chip. Following the joint treatment of the chips, the latter can optionally be separated by sawing from the support.

The connection means for connecting the conductive surfaces to the voltage source can have first addressing terminals arranged respectively on each chip, second addressing terminals, known as joint terminals, located on the substrate and at least one interconnection network linking the first terminals and the second terminals, in accordance with a predetermined connection plane.

Thus, an addressing signal or a bias voltage applied to one of the joint terminals can be distributed to all the chips of the support, for the joint treatment of given electrodes of the chips.

The connection plane can preferably be chosen in such a way as to connect in parallel the first addressing terminals in the said network or networks. A parallel connection avoids the switching off of chips when one or more electrical connections are interrupted, unlike in the case of a series connection plane.

According to an embodiment, the chips can also have multiplexing circuits for addressing first conductive surfaces from the first addressing terminals. This measure is very advantageous when each chip has a large number of first conductive surfaces to be successively addressed. It permits a reduction of the number of addressing terminals.

According to a simpler embodiment of the support, the connection means can comprise terminals, known as addressing terminals, placed on the substrate and at least one interconnection network directly connecting said addressing terminals and the first conductive surfaces along a predetermined connection plane. The connection means can also have at least one terminal connected to the second conductive surface.

According to an improvement, the support can also have a third conductive surface able to form a reference electrode with respect to the second conductive surface.

According to a variant, the support can have a third and a fourth conductive surfaces, which are able to jointly form a reference electrode.

The reference electrodes are useful for certain electrochemical reaction types, particularly those relating to polymers due to chemical deterioration risks if the absolute potential applied to the electrodes is excessive.

Other features and advantages of the invention can be better gathered from the illustrative and non-limitative description with reference to the attached drawings.

DETAILED DESCRIPTION OF EMBODIMENTS

Figure 1:
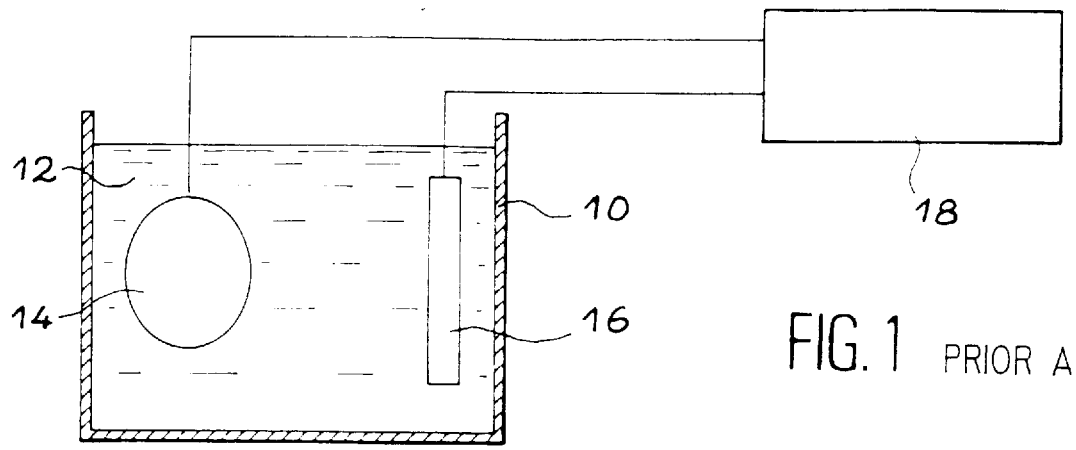
FIG. 1, already described, is a diagrammatic view of a known electrolysis installation.
Figure 2:
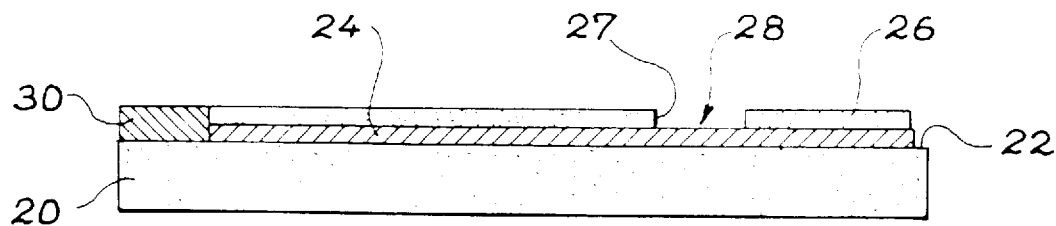
FIG. 2, already described, is a section of a support for an electrolytic deposit of a known type.
Figure 3:
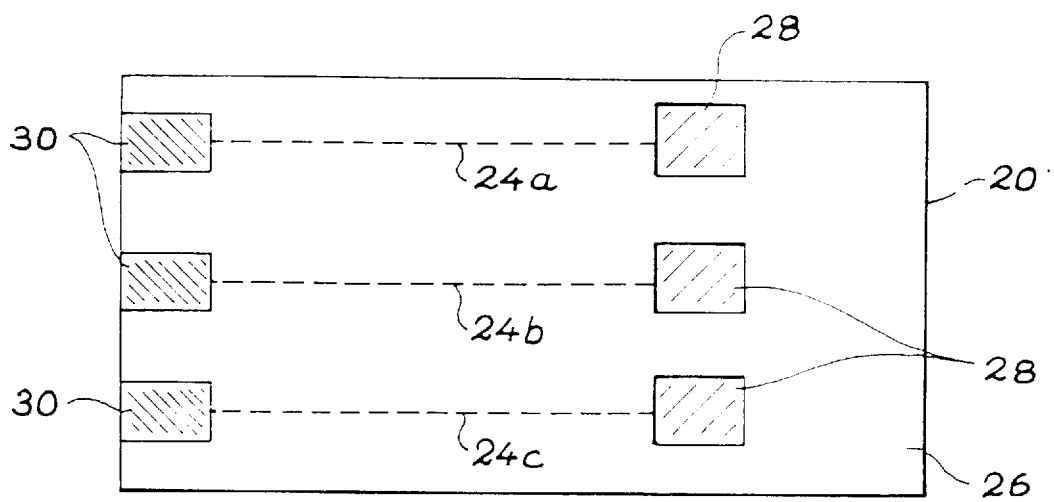
FIG. 3, already described, is a plan view of a support for successive electrolytic deposits according to a known process.
Figure 4:
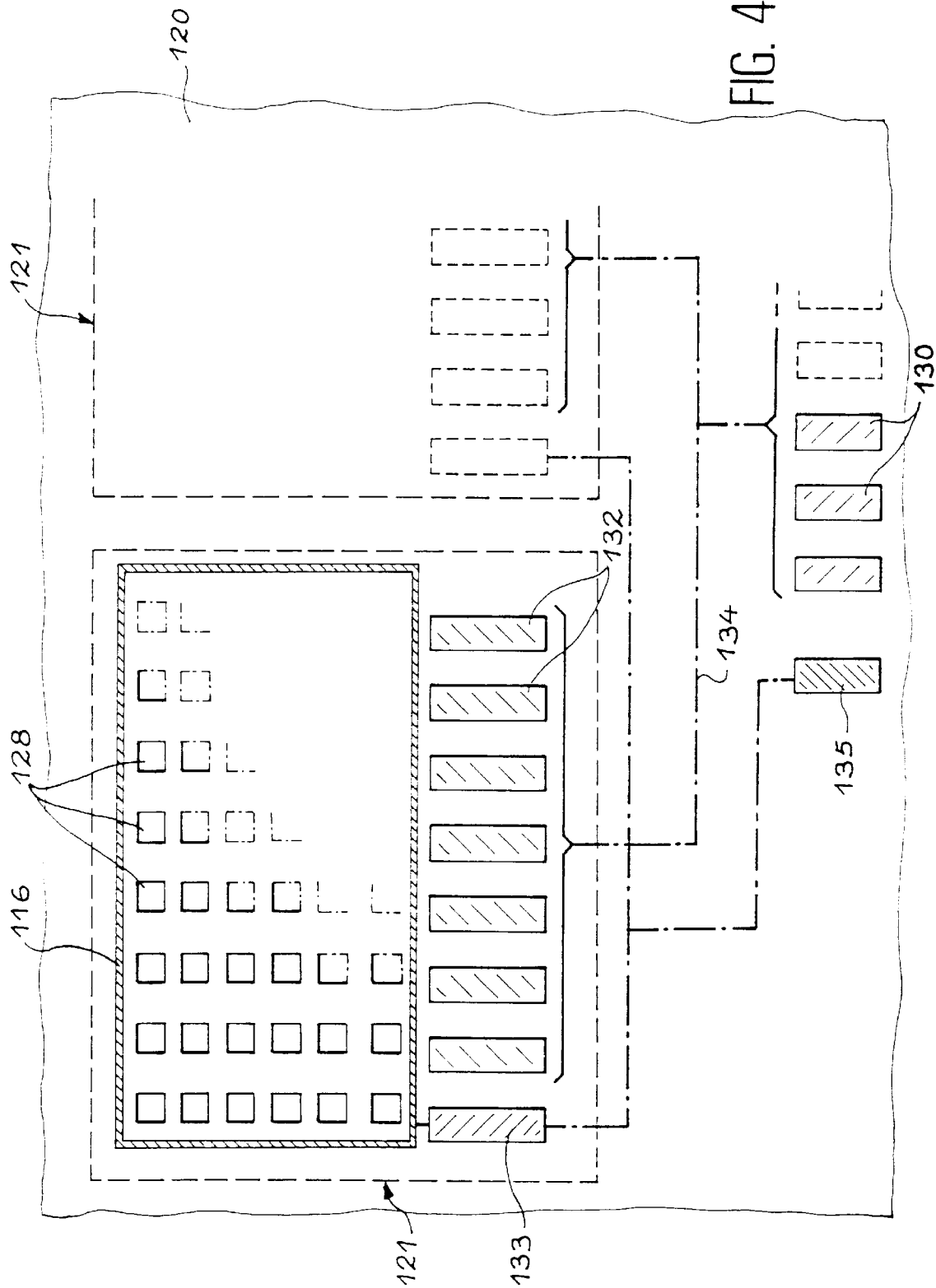
FIGS. 4, 5 and 6 are plan views of supports for electrolytic deposits according to the invention.

FIG. 4 shows a first embodiment of a support according to the invention. On an active or passive substrate 120 are formed one or more chips 121, each having a plurality of first conductive surfaces 128 able to form electrodes.

A single chip is shown in detailed form in the drawing. A plurality of identical or different chips formed on the same substrate can be simultaneously treated in order to obtain an electrolytic deposit and are then separated for individual use.

The first conductive surfaces 128 forming electrodes are addressable from first addressing terminals 132 placed on each chip. The first conductive surfaces 128 can be connected to first terminals 132 by means of a not shown connection network.

The first conductive surfaces 128 can also be connected to first terminals 132 by means of a not shown, logic multiplexing circuit. Such a circuit makes it possible to selectively address a large number of first conductive surfaces from a reduced number of terminals. Reference can be made in this connection to document (3).

When the substrate has several chips which have to be simultaneously treated, second addressing terminals 130 can be formed on the substrate. All tie first terminals of the chips are then respectively connected to second corresponding terminals. The connection between the first terminals 132 and the second terminals 130 is diagrammatically represented in the drawing by a mixed line 134. It also takes place according to a given connection plane. It is e.g. a connection plane in parallel, which permits the addressing of valid chips, even if a chip considered to be defective is disconnected.

As shown in FIG. 4, a conductive material strip 116 is provided on the support. This strip, e.g. of Au, Ag, Pt, Ni or Al, constitutes a second conductive surface in the sense of the invention and forms a counterelectrode.

In the embodiment of FIG. 4, the second conductive surface, i.e. the strip. 116, surrounds all the chip electrodes 128. Thus, each chip can be provided with its own second conductive surface forming a counterelectrode.

All the second conductive surfaces forming a counterelectrode are then respectively connected to a first terminal 133 of the corresponding chip and the first terminals 133 are mutually connected to a single joint terminal 135. The terminal 135 makes it possible to apply to all the second surfaces a counterelectrode potential.

It should be noted that the conductive material strip 116 forming the second conductive surface can also be in common for all the chips and surround all the first conductive surfaces of the support. In this case, it is directly connected to the second terminal 135.

Figure 5:
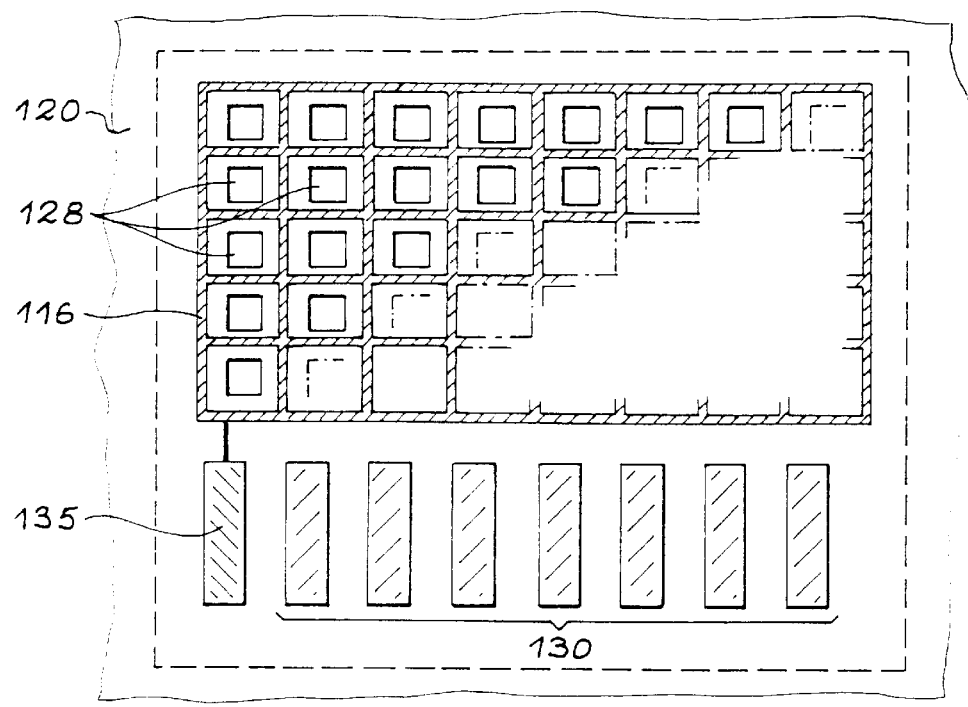

FIG. 5 shows a variant of the support according to the invention.

Figure 6:
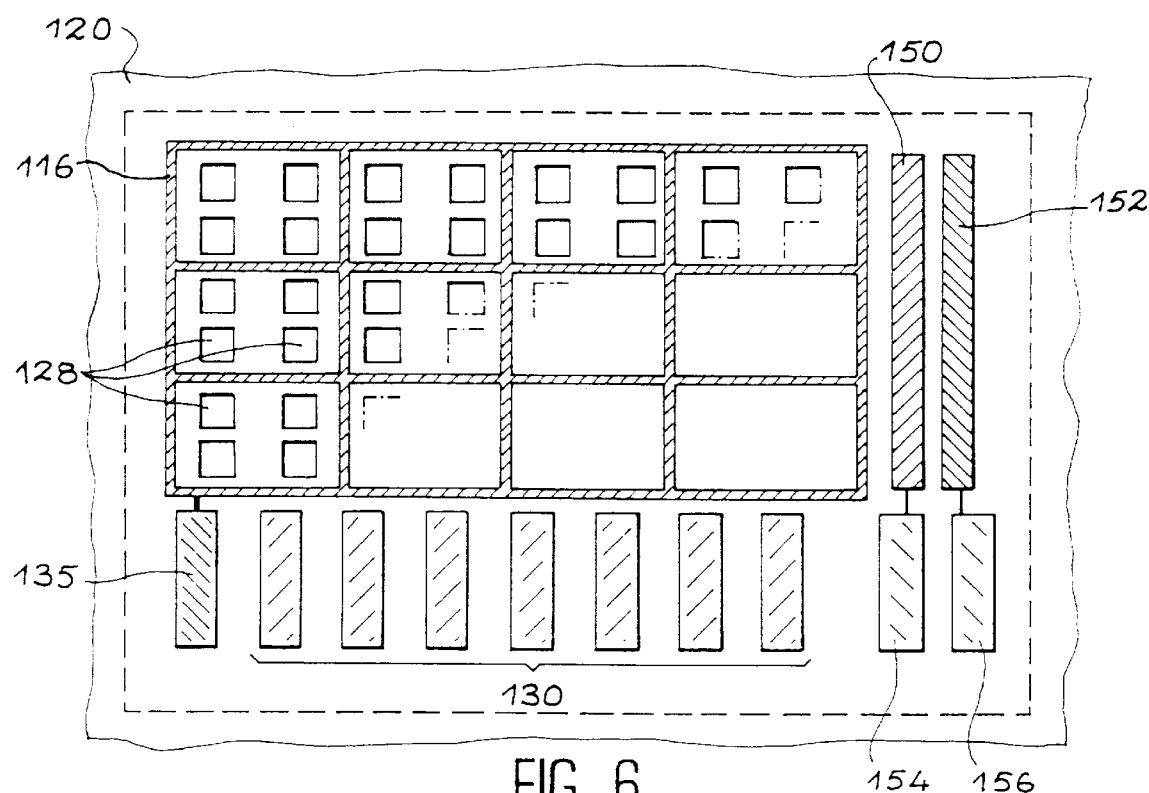

For simplification purposes FIGS. 5 and 6 show a plurality of first conductive surfaces 128 connected to connecting terminals 130 by a not shown, buried connection network. It is obvious that the conductive surfaces can belong to one or more chips and that intermediate addressing terminals such as 132 and 133 can also be used.

In FIG. 5, a second conductive surface 116 forming a counterelectrode and formed on the substrate 120, is produced in the form of a grid of an electrically conductive material. The grid has a plurality of meshes, each of which surrounds individually and in this embodiment one of the first conductive surfaces 128. The grid is connected to a terminal 135 placed on the border of the substrate 120 for applying a counterelectrode potential.

FIG. 6 shows another variant of the support according to the invention. As in FIG. 5, it is possible to see a substrate 120, first conductive surfaces 128 forming electrodes, addressing terminals 130 of the first conductive surfaces 128, and a terminal 135 for applying a potential to the counterelectrode. The counterelectrode is formed by a second conductive surface 116 in the form of a grid.

The meshes of the grid are wider than those of the support of FIG. 5. Each mesh of the grid surrounds a group of four first conductive surfaces.

The choice of the structure of the counterelectrode is linked on the one hand with the type of electrolyte used (homogeneity of the deposit linked with the resistivity of the bath and the distance between the electrode and the counterelectrode) and on the other hand the surface of the substrate usable for producing a counterelectrode.

In addition, a third and a fourth conductive surfaces 150 and 152 are formed on the substrate 120 alongside the first and second conductive surfaces.

The third and fourth surfaces 150 and 152, connected to measurement terminals 154, 156, are made from different metals having a known redox potential. It e.g. consists of a gold or platinum strip and a silver strip.

When the support is immersed in the electrolyte bath, it is possible to measure the reference potential on the terminals 154, 156 by closing the electrochemical circuit comprising the third and fourth conductive surfaces.

The measurement performed between the terminals 154 and 156 makes it possible to fix in absolute terms the potential which will be applied to the electrodes 128 and 116.

In a simplified embodiment, a single reference metal strip can be adequate. A reference potential is then measured between said metal strip and the strip or conductive material grid forming the counterelectrode. The reference metal strip and the counterelectrode must then be made from a different material.

With respect to FIGS. 4 to 6, it should be noted that the conductive surfaces forming electrodes and the surface or surfaces forming the counterelectrode or counterelectrodes are formed on the same face of the substrate.

An electrolytic deposit can be made on the first conductive surfaces by immersing the support in an electrolyte bath and by the application between the terminal 135 connected to the counterelectrode and at least one of the terminals 130 of an appropriate bias voltage.

Deposition can take place selectively on certain first surfaces by applying a voltage and optionally an addressing signal selectively to the corresponding terminals 130. The addressing signal and the voltages to be selectively applied to the terminals can be supplied by an interface of a microcomputer connected between the voltage generator 118 and the support.

Figure 7:
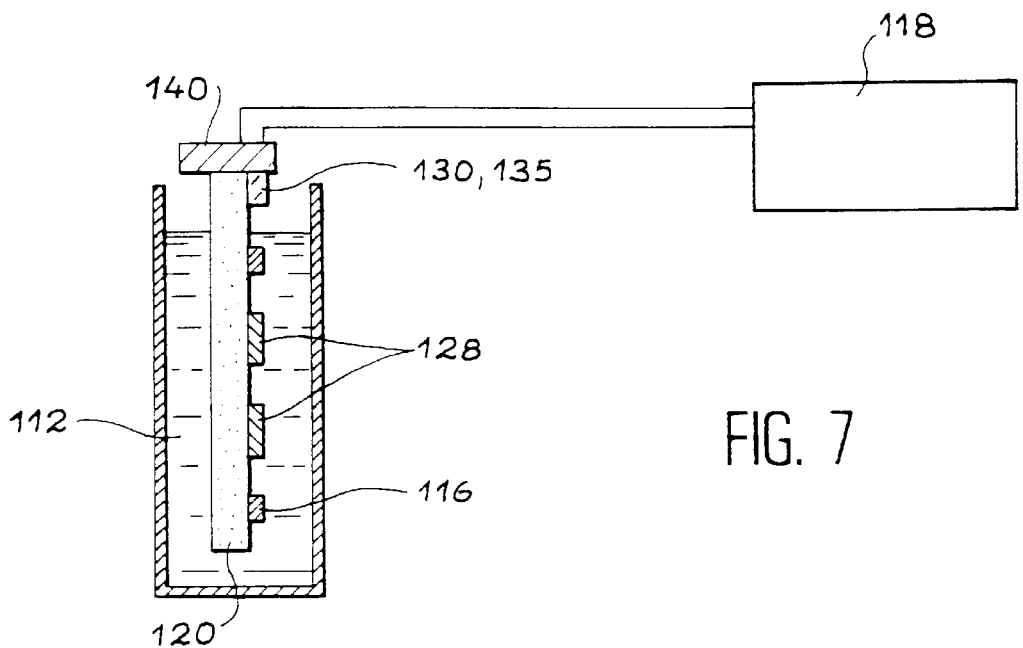
FIG. 7 is a diagrammatic view of an electrolysis installation using a support according to the invention.

FIG. 7 shows an electrolysis installation equipped with a support like that described hereinbefore. Identical references designate identical or similar elements to those of the previous drawings.

Thus, a support equipped with first surfaces 128 forming electrodes and a second conductive surface 116 forming a counterelectrode is immersed in a tank 110 containing an electrolyte 112. The connection terminals (second terminals) 130 and 135 located on an emergent portion of the support are connected to a connector 140, which permits the connection of the terminals to a voltage generator 118.

As the electrodes and the counterelectrode are placed on the same substrate, a reduced electrolyte bath volume corresponding to the size of the support is adequate.

Figure 8:
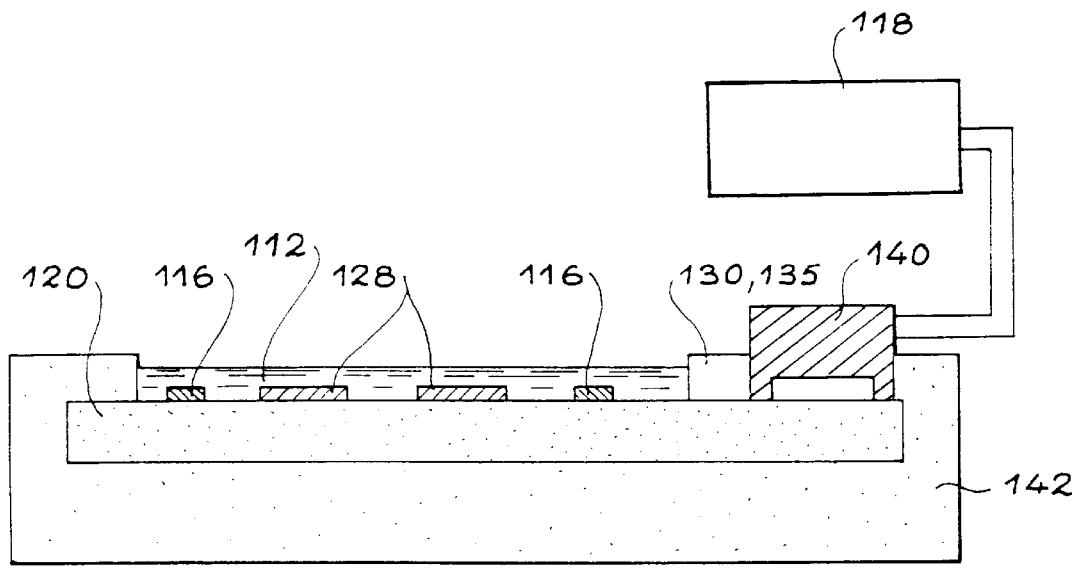
FIG. 8 is a diagrammatic section of another electrolysis installation using a support according to the invention.

FIG. 8 shows another electrolysis installation with a support according to the invention. The support equipped with first conductive surfaces 128 and a second conductive surface 116 is placed in a sample-holding tank 142 appropriate for its size.

The face of the support having the conductive surfaces is turned upwards and the terminals 130, 135 are connected to a voltage generator 118 across a connector 140.

A very thin electrolyte film is applied to the upwardly turned support face so as to moisten the conductive surfaces forming the electrode and the counterelectrode. Thus, there is only a very small electrolyte quantity such as is necessary for forming the "electrolyte bath".

Therefore the electrolyte costs for producing the deposit can also be reduced. This is particularly noteworthy when different deposits are produced on the different first surfaces and when a plurality of different electrolyte baths are necessary.

DOCUMENTS CITED IN THE PRESENT APPLICATION (1) FLUXLESS FLIP-CHIP TECHNOLOGY by P. Caillat and G. Nicolas (2) WO-94 22889

(3) A MONOLITHIC SENSOR ARRAY OF INDIVIDUALLY ADDRESSABLE MICROELECTRODES by R. Kakerow et al. Sensors and Actuators A, 43 (1994), pp 296–301.

We claim:

1. A support for an electrochemical deposit, comprising:
   a substrate, including,
   a plurality of first conductive surfaces able to constitute electrodes, at least one second conductive surface able to constitute a counter electrode, and a means for connecting said first conductive surfaces and said at least one second conductive surface to a voltage source;

wherein said at least one second conductive surface comprises a conductive material support surrounding at least a portion of said plurality of first conductive surfaces.

2. The support according to claim 1, wherein the first conductive surfaces and the at least one second conductive surface are made from a material chosen from among Al, Au, Pt, Ag and Ni.

3. The support according to claim 1, further comprising a plurality of microelectronic chips, each chip being provided with at least one of said first conductive surfaces.

4. The support according to claim 3, wherein the connection means comprises, first addressing terminals respectively placed on each chip, second addressing terminals, called joint terminals, placed on the substrate, and at least one interconnection network connecting the first terminals and the second terminals in accordance with a predetermined connection plane.

5. The support according to claim 4, wherein each chip is further provided with a multiplexing circuit for addressing said first conductive surfaces from the first addressing terminals.

6. The support according to claim 1, wherein said means for connecting comprises terminals, called addressing terminals, placed on the substrate and at least one interconnection network connecting the addressing terminals and the first conductive surfaces according to a predetermined connection plane.

7. The support according to claim 1, wherein said means for connecting comprises at least one terminal connected to said second conductive surface.

8. The support according to claim 1, further comprising a third conductive surface able to form a reference electrode relative to the second conductive surface.

9. The support according to claim 1, further comprising third and fourth conductive surfaces, which are able to jointly form a reference electrode.

10. A support for an electrochemical deposit, comprising:

a substrate, including, a plurality of first conductive surfaces able to constitute electrodes, at least one second conductive surface able to constitute a counter electrode, and a means for connecting said first conductive surfaces and said at least one second conductive surface to a voltage source;

wherein said at least one second conductive surface comprises at least one conductive material grid having a plurality of meshes, each mesh surrounding at least one of said first conductive surfaces.

11. The support according to claim 10, wherein the first conductive surfaces and the at least one second conductive surface are made from a material chosen from among Al, Au, Pt, Ag and Ni.

12. The support according to claim 10, further comprising a plurality of microelectronic chips, each chip being provided with at least one of said first conductive surfaces.

13. The support according to claim 10, wherein said means for connecting comprises terminals, called addressing terminals, placed on the substrate and at least one interconnection network connecting the addressing terminals and the first conductive surfaces according to a predetermined connection plane.

14. The support according to claim 10, wherein said means for connecting comprises at least one terminal connected to said second conductive surface.

15. The support according to claim 10, further comprising a third conductive surface able to form a reference electrode relative to the second conductive surface.

16. A support for an electrochemical deposit, comprising:

a substrate, including, a plurality of first conductive surfaces able to constitute electrodes, at least one second conductive surface able to constitute a counter electrode, and a means for connecting said first conductive surfaces and said at least one second conductive surface to a voltage source;

wherein said at least one second conductive surface comprises a plurality of conductive material strips which are interconnected and placed between the first conductive surfaces.

17. The support according to claim 16, wherein the first conductive surfaces and the at least one second conductive surface are made from a material chosen from among Al, Au, Pt, Ag, and Ni.

18. The support according to claim 16, further comprising a plurality of microelectronic chips, each chip being provided with at least one of said first conductive surfaces.

19. The support according to claim 16, wherein said means for connecting comprises terminals, called addressing terminals, placed on the substrate and at least one interconnection network connecting the addressing terminals and the first conductive surfaces according to a predetermined connection plane.

20. The support according to claim 16, wherein said means for connecting comprises at least one terminal connected to said second conductive surface.

* * * * *

UNITED STATES PATENT AND TRADEMARK OFFICE
CERTIFICATE OF CORRECTION

PATENT NO.   : 5,828,133
DATED        : October 27, 1998
INVENTOR(S)  : Patrice CAILLAT et al.

It is certified that error appears in the above-indentified patent and that said Letters Patent is hereby corrected as shown below:

On the title page, item [30] Foreign Application Priority Data information is incorrect. It should read:

--Dec. 18, 1995   [FR]   France ..........95 14972--

Signed and Sealed this

Fourth Day of May, 1999

Attest:

Q. TODD DICKINSON

Attesting Officer                    Acting Commissioner of Patents and Trademarks